United States Patent

Gelez et al.

[11] Patent Number: 5,297,009
[45] Date of Patent: Mar. 22, 1994

[54] DEVICE FOR LOCKING IN A RACK A DRAWER FOR ELECTRONIC BOARD(S)

[75] Inventors: Francois Gelez, Bry Sur Marne; Joël Aube, Ecardenville Sur Eure; Gérard Dector, Carrouges, all of France

[73] Assignee: Audio Visuel Systemes, Montreuil Sous Bois, France

[21] Appl. No.: 903,470

[22] Filed: Jun. 25, 1992

[30] Foreign Application Priority Data

Jun. 25, 1991 [FR] France .................... 91 07769
Jul. 3, 1991 [FR] France .................... 91 08288

[51] Int. Cl.⁵ .......................................... H05K 7/14
[52] U.S. Cl. .................................... 361/796; 211/41
[58] Field of Search ................. 211/41; 361/730, 752, 361/725, 796

[56] References Cited

U.S. PATENT DOCUMENTS

| 4,301,494 | 11/1981 | Jordan | 361/415 |
| 4,648,009 | 3/1987 | Beun et al. | 361/399 |

FOREIGN PATENT DOCUMENTS

| 0077092 | 4/1983 | European Pat. Off. . |
| 0369025 | 5/1990 | European Pat. Off. . |
| 1302591 | 11/1970 | Fed. Rep. of Germany . |
| 7202156 | 4/1972 | Fed. Rep. of Germany . |
| 2161309 | 2/1973 | Fed. Rep. of Germany . |
| 3542404 | 6/1987 | Fed. Rep. of Germany . |
| 3636088 | 11/1987 | Fed. Rep. of Germany . |
| 3832823 | 3/1990 | Fed. Rep. of Germany . |
| 2478422 | 9/1981 | France . |
| 225967 | 12/1924 | United Kingdom . |
| 2156424 | 10/1985 | United Kingdom . |

Primary Examiner—Leo P. Picard
Assistant Examiner—B. Lee Ledynh
Attorney, Agent, or Firm—Watson, Cole, Grindle & Watson

[57] ABSTRACT

This device for locking in a rack the front face (2) of a drawer (1) for electronic board(s) comprises a bolt (9) mounted so as to slide on the front face between a position locking it in a strike plate (11) carried by the rack and an unlocking position, and a pivoted lever (10) adapted to displace the bolt (9) between the locking and unlocking positions when it is turned respectively between a position in which it is substantially folded down along the front face (2) and a gripping position in which it projects with respect to the front face. The lever (10) is pivoted on the bolt (9) and is movable in translation together with the latter, and the lever (10) and the front face (2) have complementary members which cooperate to displace the bolt (9) and the lever (10) in translation when the lever is turned between the folded-down position and the gripping position.

12 Claims, 5 Drawing Sheets

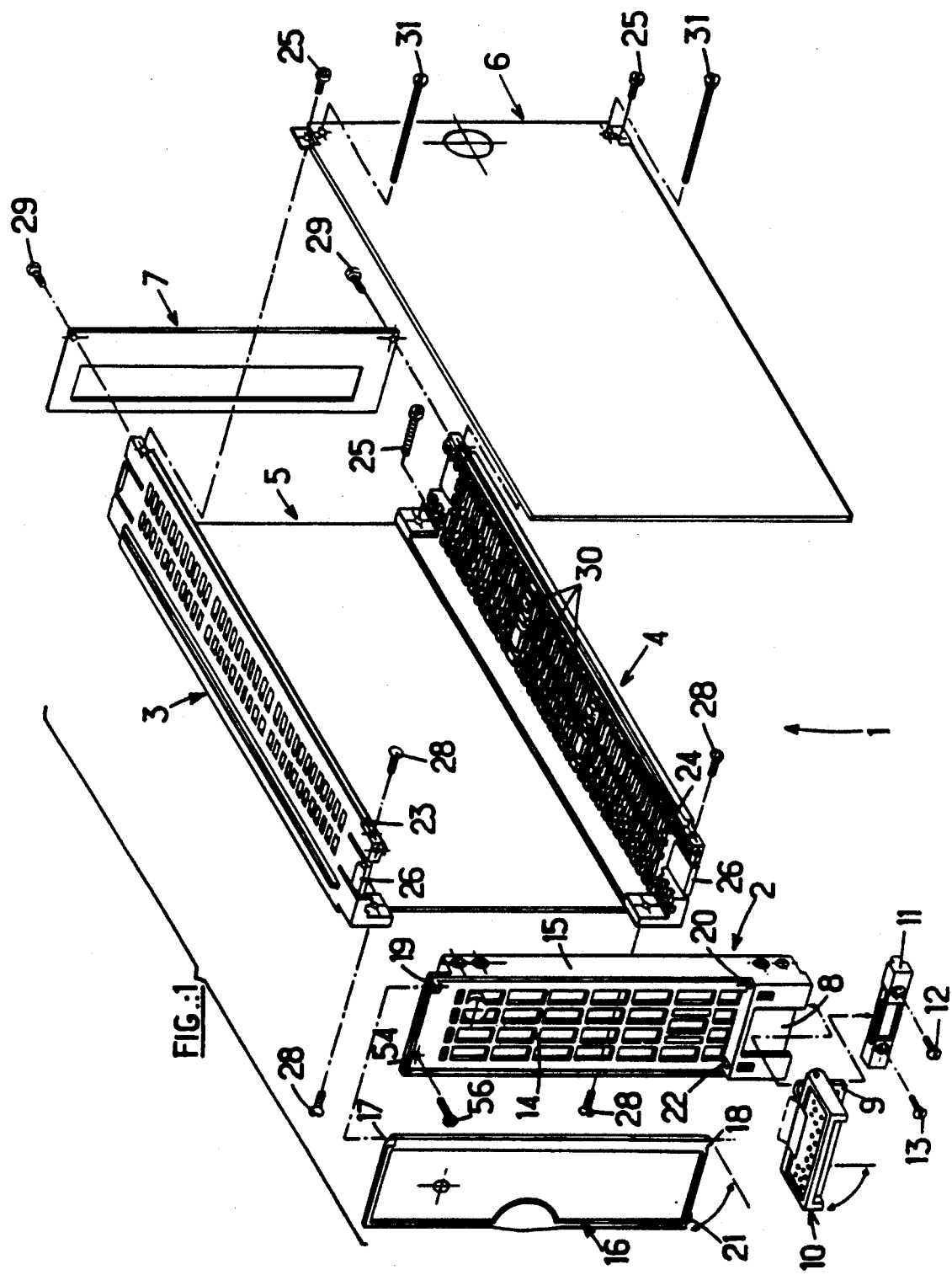

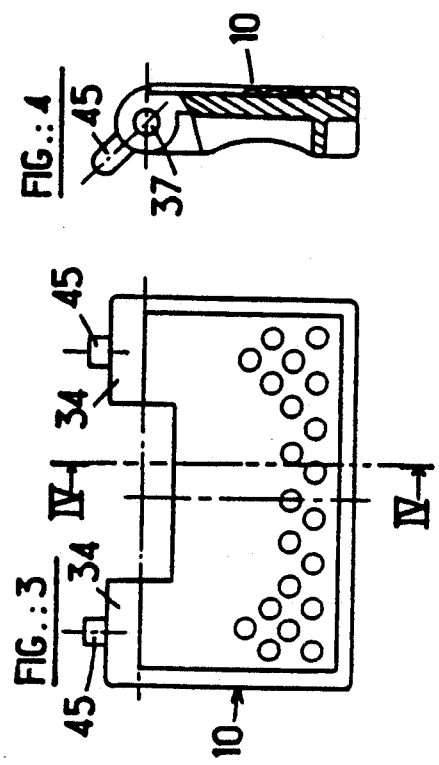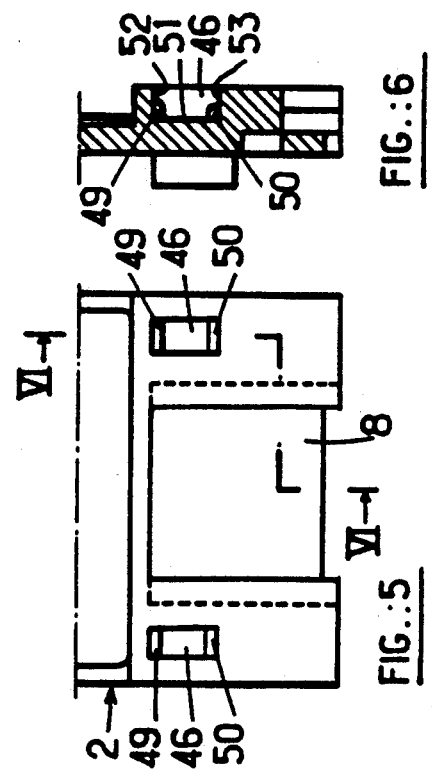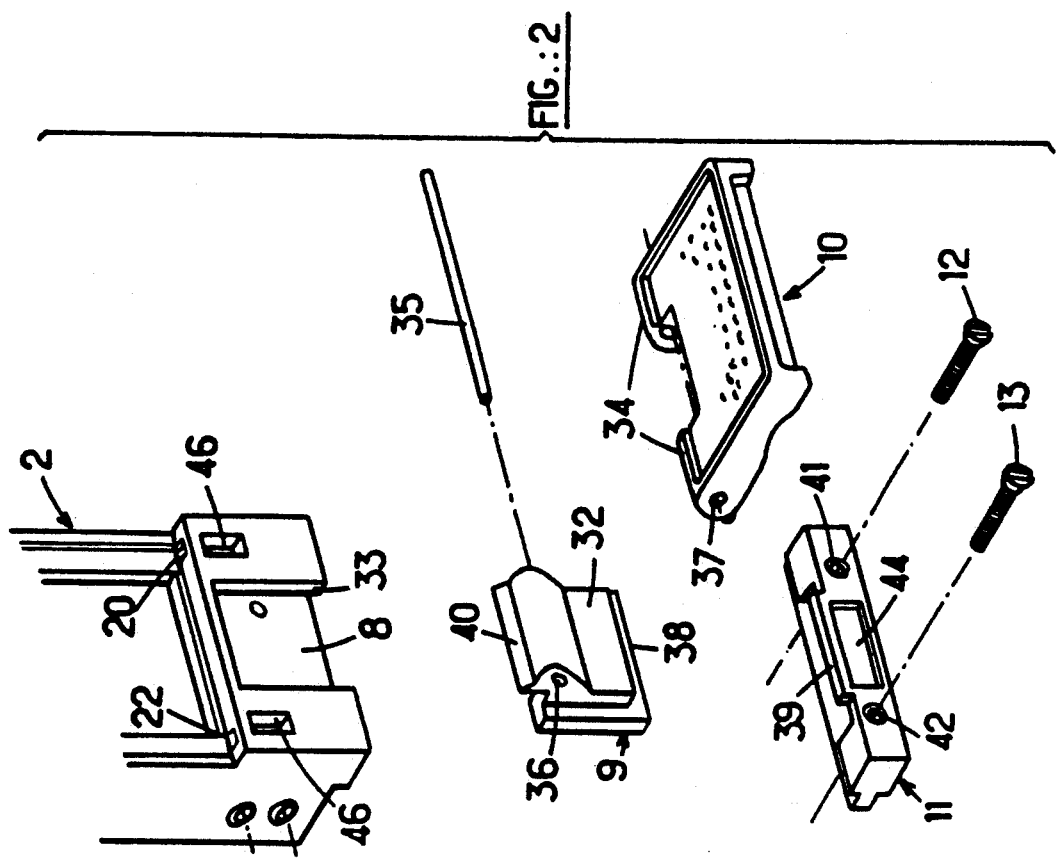

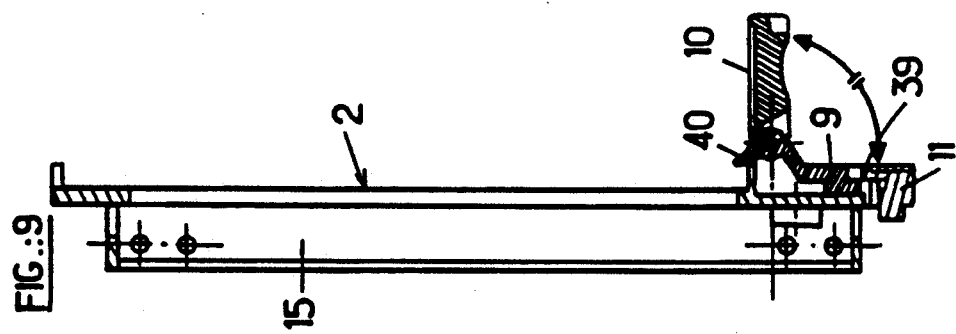
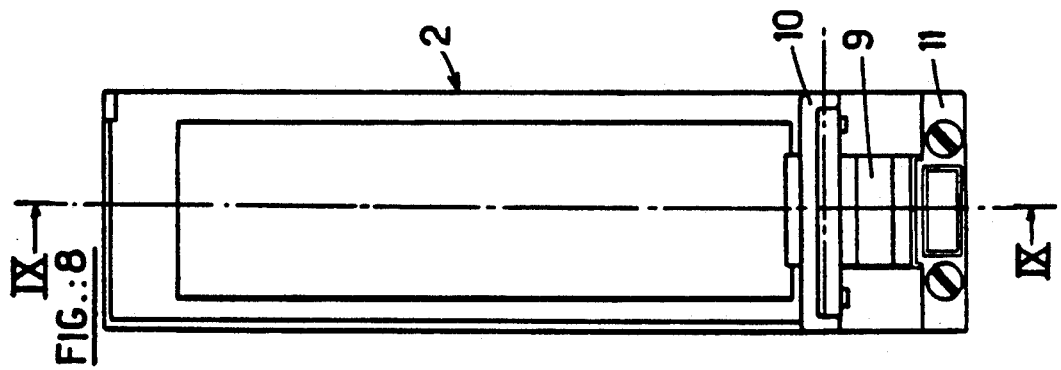
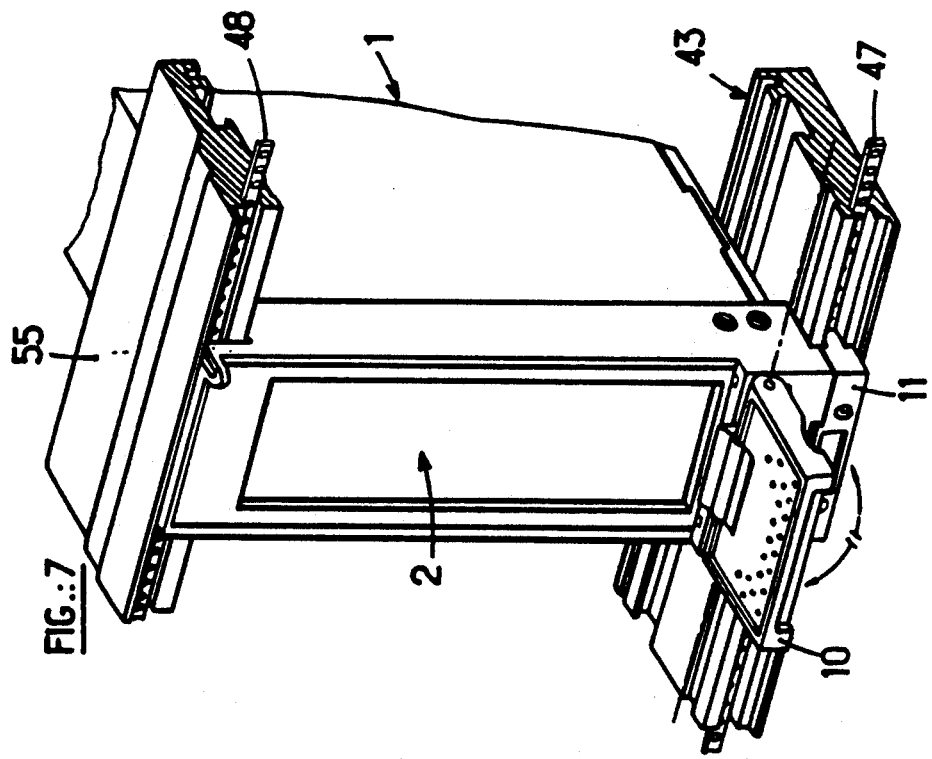

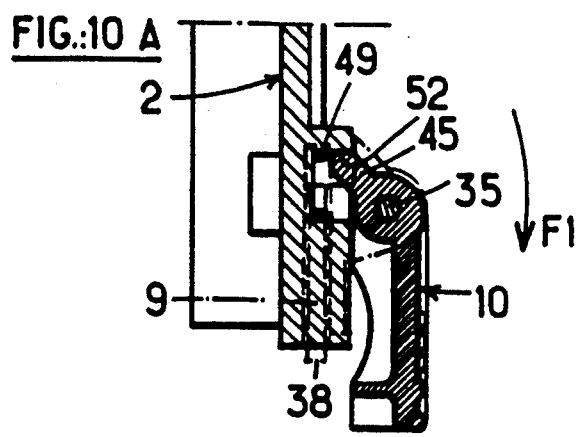
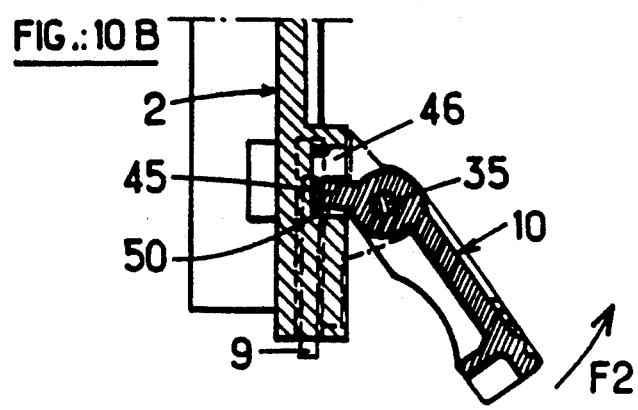
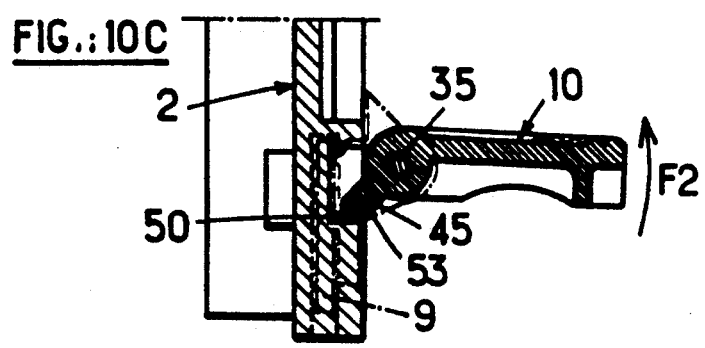
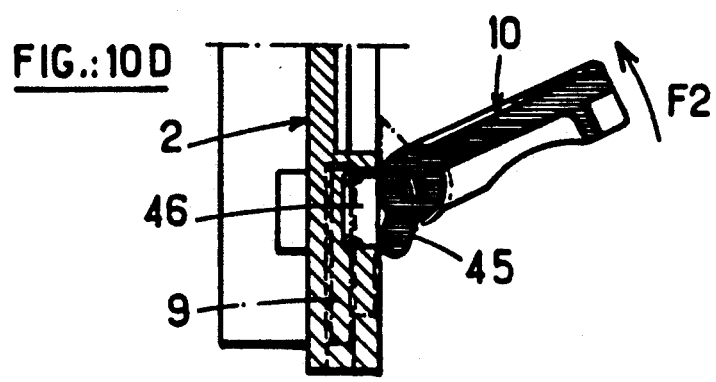

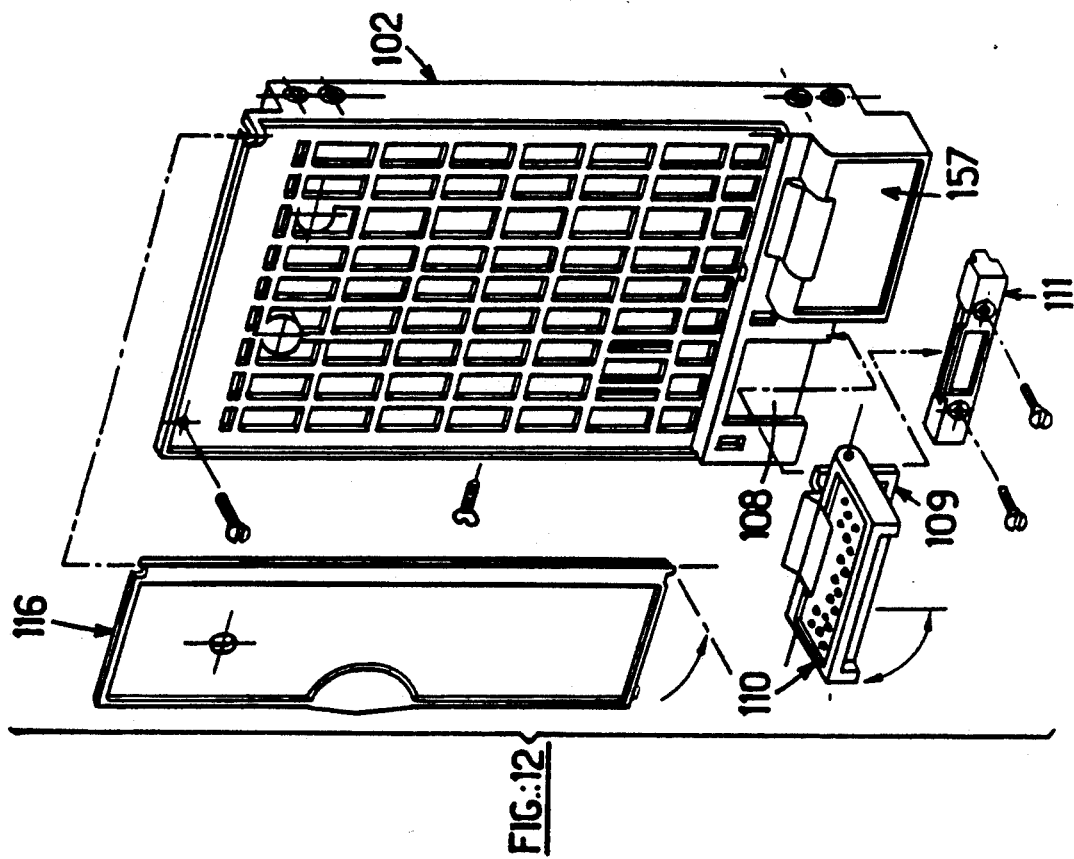
FIG.:12
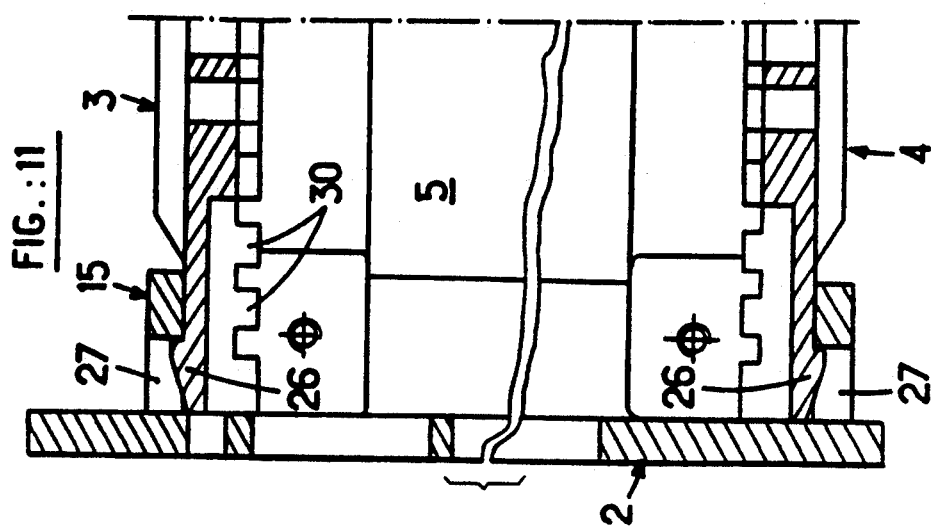
FIG.:11

DEVICE FOR LOCKING IN A RACK A DRAWER FOR ELECTRONIC BOARD(S)

The present invention relates to a device for locking in a rack the front face of a drawer for electronic board(s), and also to a drawer equipped with a device of this type.

It is known, particularly in the field of professional electronic equipment, to mount on racks a certain number of drawers, each containing one or more electronic boards, for example printed circuits carrying discrete electronic components and/or integrated circuits. These racks are generally equipped at the base with connectors making it possible to connect to the outside the electronic circuits contained on the boards. When they are of substantial dimensions, these equipment items may be composed of a bay combining a plurality of racks disposed one above the other and/or side by side.

A large number of applications exist in which the drawers must be able to be easily placed in position in the racks and removed from them. This is in particular the case when the drawers constitute modules having specific functions (signal processing in the audio and video fields, for example) capable of being assembled in a large number of different combinations to meet the user's specific temporary needs. It is then convenient to provide, on the drawers and on the rack, complementary locking means which will enable the drawers to be easily handled without the use of tools.

The document DE-A-3,636,088 describes a locking device in which the top and bottom frames of a rack are equipped in their front part with a specially shaped strike plate adapted to cooperate with a bolt of complementary shape carried by the front face of a drawer or the like equipped with an electronic board. The bolt is slidable at right angles to the front face between a locking position in the strike plate and an unlocking position under the action of a lever pivoted on the front face and adapted to displace the bolt between the locking position and the unlocking position when it is turned respectively between a position in which it is substantially folded down along the front face and a gripping position in which it projects with respect to said front face.

This locking device of the prior art nevertheless has the disadvantage of being of a relatively complex and bulky construction which utilizes a casing attached to the front face and containing a lever pivoted in this casing and a spring held captive in the latter and cooperating with the bolt to urge the latter resiliently in a direction at right angles to its sliding movement. Furthermore, the rack cannot be of a standard type, because it must be equipped in defined positions with strike plates of appropriate configuration to cooperate with the bolts carried by the drawers or the like.

The expression "standard rack", here designates a framework having a parallelepipedal general shape and composed of sectional members, wherein at least the upper and lower sectional members of the front part have a row of threaded holes regularly spaced apart. Conventionally, the drawers in these standard racks are fixed with the aid of screws received in the threaded holes via apertures provided at the top and bottom of the front face of the drawers. Such standard racks are of course much less expensive than specific racks equipped with strike plates as described in Patent DE-A-3,636,088, but on the other hand the method of locking and unlocking the drawers with screws is found to be much less convenient when the drawers are frequently handled.

The invention seeks to provide a device for locking the front face of a drawer in a rack, which device is of simple and inexpensive construction, small in size, and easy to handle. Another object of the invention is to provide a locking device which can be used with standard racks not originally provided with any locking means for the drawers except for threaded holes or other equivalent conventional fixing means.

To this end the subject of the invention is a device for locking in a rack the front face of a drawer for electronic board(s), which comprises a strike plate carried by said rack, a bolt carried by said front face to slide between a position locking it in said strike plate and an unlocking position, a lever pivoted on said bolt and movable in translation together with the latter, and complementary cam means carried by said lever and said front plate, said complementary cam means cooperating together to displace said bolt in translation between said locking and unlocking positions when said lever is turned respectively between a position in which it is substantially folded down along said front face and a gripping position in which it projects with respect to said front face. This locking device is of a particularly simple construction as the lever is carried by the bolt and is movable in translation together with the latter, so that no part is pivoted on the front face of the drawer.

Other features and advantages of the invention will emerge from the following description of embodiments, which are given as examples and illustrated in the accompanying drawings, in which:

FIG. 1 is an exploded view in perspective of a drawer provided with a locking device according to the invention;

FIG. 2 is an exploded view in perspective, on a larger scale, of the locking device with which the drawer shown in FIG. 1 is equipped;

FIG. 3 is a front view in elevation of the lever or handle of the locking device shown in FIGS. 1 and 2;

FIG. 4 is a sectional view along the line IV—IV in FIG. 3;

FIG. 5 is a front view in elevation of the lower part of the front face of FIGS. 1 and 2

FIG. 6 is a sectional view along the line VI—VI in FIG. 5;

FIG. 7 is a partial view in perspective of the drawer shown in FIG. 1, mounted in position in a rack;

FIG. 8 is a front view in elevation of the front face of the drawer shown in FIG. 7;

FIG. 9 is a sectional view along the line IX—IX in FIG. 8;

FIGS. 10A to 10D are views in partial section of the locking device, showing the lever and the bolt in different operating positions;

FIG. 11 is a partial view in longitudinal section of the casing shown in FIG. 1; and FIG. 12 is an exploded view in perspective similar to FIG. 1, showing the front face of a drawer according to a second embodiment of the invention.

Referring to FIG. 1, a drawer 1 intended to receive electronic boards (not shown) is in the form of a parallelepipedal casing comprising a front face 2, an upper flank 3 and a lower flank 4 which are joined to a first side wall 5, a second side wall 6, and an optional rear closure plate 7.

The front face 2 has at the bottom part a groove 8 having a T-shaped section and extending, from its lower edge, parallel to the general plane of said front face, in which slot a bolt 9 can slide on which is pivoted a lever 10, which also serves as a gripping handle. The groove 8 is open at its end adjacent to the lower edge of the front face 2. The bolt 9 can slide in the groove 8 between an unlocked position and a locked position in which it projects into a strike plate 11 intended to be fixed by means of screws 12 and 13 to a rack (not shown in FIG. 1) intended to receive the drawer 1.

The front face 2 is made of a plastic material which conducts electricity and, above its lower part provided with the groove 8, has a window consisting of a grille 14, the bars of which can be cut at will by means of cutting pliers or the like such as to enable electronic components such as light emitting diodes to be placed in one or more desired locations behind the grille 14. The bars of the grille 14 must be sufficiently small to be able to be cut easily, while having sufficient width to enable a label (not shown) identifying and personalizing the drawer to be stuck over the entire grille 14. The aforesaid components may be carried by a printed circuit (not shown) mounted in the drawer, as will be explained further on, or be received in a skirt 15 projecting toward the rear from the front face 2. The front face 2 is completed by a door 16 of plastic material which comprises, along one of its longitudinal edges, two aligned studs 17 and 18 received respectively in sockets 19 and 20 integrally molded with the front face 2 to form hinges. The door 16 can be immobilized in the closed position by a stud 21 intended to be engaged resiliently in a socket 22 on the front face 2.

The upper flank 3 and lower flank 4 are in the form of grilles of a plastic material which conducts electricity, which grilles are welded to the metal side wall 5. The flanks 3 and 4 are provided with respective longitudinal grooves 23 and 24 which are turned toward one another and between which the other side wall 6, likewise of metal, is received. The walls 5 and 6 may optionally be fixed to the flanks 3 and 4 by a set of screws given the reference 25.

The front face 2 is fitted by its skirt 15 over the corresponding end of the flanks 3 and 4. To this end the flanks 3 and 4 carry resilient tabs 26 shaped as hooks, and the upper and lower edges of the skirt 15 are provided with slots 27 (see also FIG. 11) in which the hooks 26 can be engaged. This fixing by clipping of the front face 2 on the elements 3, 4 and 5 securely attached to the drawer may optionally be supplemented by means of screws given, overall, the reference 28. In the mounted position of the front face 2 the side walls 5 and 6 are situated in line with the side edges of the skirt 15 and bear against them.

As can be seen from the above description, the side wall 6 can be drawn back out of the slide 23, 24 toward the rear and thus give access to the interior of the drawer without the front face 2 having to be removed. The rear wall 7, which is optional and is fixed to the flanks 3 and 4 by means of screws 29, is not an obstacle to this withdrawal of the side wall 6 toward the rear.

On their sides facing one another the flanks 3 and 4 have a network of bosses 30 defining two sets of grooves at right angles, namely a set of 43 transverse grooves parallel to the front face 2 and a set of 4 longitudinal grooves perpendicular to the transverse grooves and to the front face 2. The drawer 1 can thus receive electronic boards in the longitudinal and/or in the transverse direction. The electronic boards are preferably connected to each other in pairs in conventional manner by conductors buried in a strip of plastic material and ending in connectors plugged into corresponding connectors on the boards. The boards disposed parallel to the front face 2 require no fixing in the drawer, as they are sandwiched between the side walls 5 and 6. The boards disposed longitudinally in the drawer are secured by fixing the conector fastened to these boards in the drawer, by means of screws 31. As a variant, if a plate 7 is fitted at the rear of the drawer, no fixing is required because the boards are then sandwiched between the front face 2 and the rear face 7.

Referring also to FIGS. 2 to 10, the bolt 9 has on one of its faces a base 32 which, when the bolt is mounted in the groove 8, projects through a cutout 33 in said groove. The handle 10 forms a yoke 34 and is connected to the bolt 9 by a metal pin 35 extending through aligned holes 36 and 37 in the bolt 9 and in the yoke 34 respectively.

The front edge 38 of the bolt 9 is intended to be engaged behind a projecting rim 39 on the strike plate 11 in the locking position, while on the side opposite the front edge 38, the base 32 ends in the form of a projecting beak 40 adapted to limit the movement of the handle 10 beyond the gripping position shown in FIGS. 7 to 9.

The strike plate 11 is pierced by two holes 41 and 42 for the passage of the screws 12 and 13 for fixing it in a desired location along a rail 43 of the rack, said rail having a strip 47 provided with threaded holes (FIG. 7). Between the holes 41 and 42 said strike plate has on its front wall a recessed surface 44 intended to receive a label carrying for example identification data for the drawer intended to be placed in the rack in the location defined by the strike plate.

Each of the cheeks of the yoke 34 of the handle 10 carries a stud 45 projecting obliquely toward the rear and toward the bottom face of the handle 10. The two studs 45 of the handle 10 are intended to be received respectively in two recesses 46 formed in the front face 2, on either side of the T-shaped groove 8. Each recess is in the form of a rectangular groove provided at its opposite ends with bosses 49 and 50 respectively projecting from the corners formed between the bottom 51 of the groove and its end walls 52 and 53 respectively.

The bosses 49 and 50 form cam surfaces the purpose of which will be better understood by referring to FIGS. 10A to 10D.

In the locking position shown in FIG. 10A the handle 10 is folded down along the front face 2 and held in that position because each of the studs 45 bears in the corresponding recess between the boss 49 and the end wall 52. An movement of the handle 10 beyond this position in the direction indicated by the arrow F1 is prevented by the fact that the underneath of the handle then bears against the front face 2. In this position the front edge 38 of the bolt 9 projects out of the T-shaped groove 8. If a drawer is in position in a rack in line with a strike plate 11, as shown in FIG. 7, and if the handle is in the locking position, as shown in FIG. 10A, the front edge 38 of the bolt 9 is engaged behind the rim 39 of the strike plate 11 and thus locks the drawer in position in the rack.

In order to unlock the drawer, the handle 10 is turned upward in the direction indicated by the arrow F2, which entails passing through a first hard point when the end of the studs 45 passes onto the apex of the bosses 49. Passage through this hard point is achieved by resilient deformation of the different parts 2, 9 and 10 through appropriate selection of the plastic material of which they are made and of their manufacturing tolerances. During the continuation of the turning movement of the handle 10 in the direction of the arrow F2, the bolt 9 remains stationary as long as the studs 45 turn freely in the recesses 46. When the studs 45 encounter the bosses 50, the continuation of the turning of the handle 10 in the direction of the arrow F2 has the effect of pushing back in the upward direction, parallel to the front face 2, the pivot pin 35 and the bolt 9 connected to it. The movement of the bolt 9 is continued until its rear edge comes to bear against the bottom of the groove 8. The handle 10 then offers resistance, but, as it continues to turn in the direction of the arrow F2, another hard point is passed through when the ends of the studs 45 pass onto the apex of the bosses 50 through resilient deformation. The handle 10 is then immobilized in the unlocking position shown in FIG. 10C through the fact that the end of each of the studs 45 is engaged under light force between the boss 50 and the adjacent end wall 53. In this position the handle 10 extends substantially at right angles to the front face 2 and offers a gripping means enabling a drawer to be easily extracted or placed in position in the rack. As can also be seen in FIG. 9, in this position the bolt 9 is sufficiently retracted to be able to pass above the rim 39 of the strike plate 11.

The bolt 9 is mounted so as to slide freely in the groove 8 parallel to the front face 2, and it is retained therein solely by the engagement of the studs 45 in the recesses 46. However, the bolt 9 can be entirely disengaged from the groove 8 by continuing, from the position shown in FIG. 10C, the movement of the handle 10 upward in the direction of the arrow F2 until, through resilient deformation, the studs 45 come completely out of the recesses 46, as shown in FIG. 10D. In order to free the bolt 9 and the handle 10 completely, it is sufficient to slide the handle 10 downward while keeping it in the position shown in FIG. 10D, until the bolt 9 comes completely out of the groove 8, as shown in particular in the exploded view in FIG. 1.

A bolt 9 is placed in position in a front face 2 by carrying out the inverse operations to those just described. It will also be noted that, on passing from the gripping or unlocking position (FIG. 10C) to the locking position (FIG. 10A), the downward movement of the bolt 9 results from the fact that the studs 45 come to bear against the bosses 49, which has the effect of pushing back the pivot pin 35 downward parallel to the front face 2.

The locking device just described utilizes only a very small number of parts, namely the front face 2, the bolt 9, the handle 10, the strike plate 11, and the pin 35. The pin 35 is a simple metal rod, while the front face 2, the bolt 9, the handle 10 and the strike plate 11 may be made of polycarbonate plastic material by an injection molding operation. The manufacture of these parts and their assembly are consequently extremely simple and inexpensive, and the replacement of a damaged part, when necessary, is particularly easy.

It will also be noted that a front face 2 by itself (that is to say without the elements 3, 4, 5, 6, and 7) can be locked on a rack in order to shroud it in cases where it is only partly equipped with drawers. For this purpose a hole 54 (FIG. 1) is provided at the top of the front face 2 to enable it to be fixed by means of a screw 56 in a threaded hole in a strip 48 forming part of an upper rail 55 of the rack (FIG. 7). However, in order to avoid handling the screws, as a variant the front face 2 may be provided at the top with a second locking device identical to that described above. When the front face 2 forms part of a drawer, this fixing at the top is not necessary, because the drawer held by slides in the rack can move only in translation.

FIG. 12 illustrates a second embodiment of the invention, in which the same reference numerals as in FIGS. 1 to 11 are used, with the addition of 100, to designate corresponding members. In this variant the front face is intended to equip drawers having a width twice that of the drawers in the embodiment shown in FIGS. 1 to 11. However, this front face 102 has only a single locking device placed at the side of an integrally molded part 157 which, for purely esthetic reasons, has the same appearance as the locking device when the handle of the latter is folded down in the locked position. Preferably, this part 157 also serves as a foolproof positioning device in that a double drawer cannot be placed in position in a rack if, in line with the part 157, a strike plate is fixed to the lower rail 43 of the rack. For this purpose the lower edge of the front face has a downwardly projecting rib (which is masked by the part 157 and consequently is not visible in FIG. 12). If a strike plate 11 is fixed to the rail 43 in line with the part 157, this rib will abut against the rim 39 of the strike plate 11 and consequently prevent complete engagement of the drawer in the rack.

It is obvious that the embodiments described are only examples and that they could be modified, particularly by substituting equivalent techniques, without thereby departing from the scope of the invention. Thus, for example, the groove 8 can be formed between a plane part of the front face 2 and an attached part fixed on the latter by any appropriate means, such as adhesive bonding, screwing, etc.

We claim:

1. A device for locking in a rack the front face of a drawer for electronic board(s), which comprises a strike plate carried by said rack, a bolt carried by said front face to slide between a position locking it in said strike plate and an unlocking position, a lever pivoted on said bolt and movable in translation together with the latter, and complementary cam means carried by said lever and said front face, said complementary cam means cooperating together to displace said bolt in translation between said locking and unlocking positions when said lever is turned respectively between a position in which it is substantially folded down along said front face and a gripping position in which it projects with respect from said front face.

2. The device according to claim 1, in which said bolt is mounted so as to slide in a groove provided in said front face, extending from an edge of the latter.

3. The device according to claim 2, in which said complementary cam means comprise at least one stud projecting on said lever and two cam surfaces provided on said front face, said stud being adapted to be supported against said cam surfaces and to push back said lever and said bolt into said locking and unlocking positions when said lever is turned respectively into said folded-down and gripping positions.

4. The device according to claim 3, in which said cam surfaces consist of two bosses respectively adjacent to two opposite ends of a housing in said front face and cooperating with said stud to form two hard points holding said lever respectively in said folded-down and gripping positions.

5. The device according to claim 4, in which said stud and said housing constitute means for retaining said bolt in said groove, and said stud is shaped so as to be disengaged by resilient deformation from said housing by turning said lever beyond said gripping position to a position freeing the bolt and to be engaged by resilient deformation in said housing by turning said lever toward said gripping position from said position freeing the bolt.

6. The device according to claim 4, in which said front face has two housings formed on either side of said groove, and the lever carries two studs adapted to cooperate respectively with said housings.

7. The device according to claim 2, in which said lever is pivoted on a base of said bolt which base is adapted to project through a cutout in said groove.

8. The device according to claim 1, in which said strike plate is a detachable part fixed to said rack.

9. The device according to claim 8, in which said strike plate, said bolt, said lever and said front face are molded parts made of plastic material.

10. A drawer for electronic board(s) which is intended to be mounted so as to slide in a rack and has a front face equipped with a device for locking said drawer in said rack, in which said locking device comprises a strike plate carried by said rack, a bolt carried by said front face to slide between a position locking it in said strike plate and an unlocking position, a lever pivoted on said bolt and movable in translation together with the latter, and complementary cam means carried by said lever and said front face, said complementary cam means cooperating together to displace said bolt in translation between said locking and unlocking positions when said lever is turned respectively between a position in which it is substantially folded down along said front face and a gripping position in which it projects with respect to said front face.

11. A drawer according to claim 10, comprising an upper flank and a lower flank which are provided with grooves at right angles for the selective mounting of electronic boards parallel and at right angles to said front face.

12. A drawer according to claim 10, characterized in that said front face and at least one flank of said drawer are provided with complementary means for fixing by clip-in engagement.

* * * * *